United States Patent
Lowery et al.

(10) Patent No.: US 6,878,973 B2
(45) Date of Patent: Apr. 12, 2005

(54) REDUCTION OF CONTAMINATION OF LIGHT EMITTING DEVICES

(75) Inventors: Christopher Haydn Lowery, Fremont, CA (US); Troy Trottier, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 134 days.

(21) Appl. No.: 09/938,407

(22) Filed: Aug. 23, 2001

(65) Prior Publication Data

US 2003/0071568 A1 Apr. 17, 2003

(51) Int. Cl.[7] .......................... H01L 33/00; H01L 23/29
(52) U.S. Cl. .......................... 257/100; 257/98; 257/99; 257/789; 257/795
(58) Field of Search .......................... 257/98–100, 729, 257/753, 788, 789, 791, 795; 438/26, 28, 29, 34–35

(56) References Cited

U.S. PATENT DOCUMENTS

| | | | | |
|---|---|---|---|---|
| 5,561,329 A | * | 10/1996 | Mine et al. | 257/788 |
| 6,132,569 A | * | 10/2000 | Shiozaki | 204/192.27 |
| 6,455,878 B1 | * | 9/2002 | Bhat et al. | 257/99 |
| 2002/0187571 A1 | * | 12/2002 | Collins, III et al. | 438/29 |

FOREIGN PATENT DOCUMENTS

EP  0 926 744 A2  6/1999

* cited by examiner

Primary Examiner—Donghee Kang
(74) Attorney, Agent, or Firm—Patent Law Group LLP

(57) ABSTRACT

A light emitting device and a method of making the same are provided. The light emitting device includes a light emitting diode and a submount. A phosphor material is disposed around at least a portion of the light emitting diode. An underfill is disposed between a first surface of the light emitting diode and a first surface of the submount. The underfill reduces contamination of the light emitting diode by the phosphor material.

36 Claims, 2 Drawing Sheets

REDUCTION OF CONTAMINATION OF LIGHT EMITTING DEVICES

FIELD OF THE INVENTION

The present invention relates generally to light emitting devices and more particularly to the reduction of contamination of light emitting devices.

BACKGROUND OF THE INVENTION

The emission spectrum of a light emitting diode ("LED") typically exhibits a single rather narrow peak at a wavelength ("peak wavelength") determined by the structure of the light emitting diode and the composition of the materials from which it is constructed. For example, the emission spectra of InGaN based LEDs typically peak at wavelengths from about 400 nanometers (nm) to about 450 nm (UV to blue) and typically have widths at half maximum of about 20 nm to about 50 nm.

Luminescent materials ("phosphors") are used with LEDs to produce light emitting devices with different wavelengths. The light emitted by the LED is absorbed by the phosphors, and the phosphors emit light of a different wavelength in response to the absorbed light. For example, InGaN based LEDs can be used with phosphors to produce green light with wavelengths of about 536 nm. A portion of the blue light emitted by the InGaN based LED is absorbed by the phosphors, which in response emit green light.

Phosphor converted LEDs are useful for producing light of different wavelengths, but the phosphors may contain or produce contaminants that degrade the performance of a LED. Contaminants may migrate to and react with a layer of the LED, thereby degrading the performance of the LED. Contaminants may also be present in materials used in packaging LEDs, such as encapsulation materials. Moisture is another source of contamination of LEDs.

Thus, there is a need to reduce the likelihood of contamination of light emitting diodes.

SUMMARY

The present invention relates to a light emitting device. The light emitting device includes a light emitting diode (LED) and a submount. A phosphor material is disposed around at least a portion of the light emitting diode. An underfill is disposed between a first surface of the LED and a first surface of the submount. The underfill reduces contamination of the LED by the phosphor material.

In one embodiment, the LED includes a reflective layer, such as silver, and the phosphor material contains sulfur. The sulfur-containing phosphor material includes but is not limited to strontium thiogallate, calcium thiogallate, strontium sulfide, and any combination thereof. In a humid environment, the moisture reacts with the phosphor, and the phosphor produces sulfide ions that could react with the silver layer (or other reflective layer) to reduce the efficiency of the LED. The underfill prevents this reaction from occurring.

In one embodiment, the underfill material includes but is not limited to cyanate ester resin, epoxy resin, epoxy, urethane, acrylate, and any combination thereof. In yet another embodiment, the underfill also includes a gettering compound. The gettering compound includes a gettering ion and a counter-ion to the gettering ion. The gettering ion may include but is not limited to a Group VA element, a Group VB element, a Group VIB element, a Group IVA element, an organic ligand, and any combination thereof. The gettering ion and a sulfide ion may form a compound with a solubility product less than about $10^{-30}$.

A method of making a light emitting device is also provided. Phosphor material is disposed around at least a portion of a LED. Underfill is disposed between a first surface of the LED and a first surface of the submount. The underfill reduces contamination of the LED by the phosphor material.

BRIEF DESCRIPTION OF THE DRAWINGS

For a more complete understanding of the present invention and for further features and advantages, reference is now made to the following description, taken in conjunction with the accompanying drawings, in which.

In the drawings, like numerals are used for like and corresponding parts.

DETAILED DESCRIPTION

Contaminants are a source of problems in packaged light emitting devices (LEDs). Contaminants may react with a layer of a LED and may change the properties of that layer, potentially degrading the performance of the LED. Sources of contaminants in a packaged LED include phosphors, encapsulation materials, and moisture.

Phosphors may contain or produce contaminants that react with a LED. For example, sulfur-containing phosphors may produce a contaminant, sulfide ions, in the presence of another contaminant, water. Sulfur-containing phosphors include but are not limited to strontium thiogallate, calcium thiogallate, strontium sulfide, and any combination thereof. In humid environments, moisture, i.e., water, may diffuse into the packaged LED and may react with the phosphors to form sulfide ions. For example, strontium sulfide may react with water to form strontinum hydroxide and hydrogen sulfide.

$$SrS + 2H_2O \rightarrow Sr(OH)_2 + H_2S \qquad (1)$$

The hydrogen sulfide may further dissociate into sulfide ions and hydrogen ions.

$$H_2S \rightarrow HS^- + H^- \qquad (2)$$

The sulfide ions may be highly mobile and may migrate in all directions.

Migrating sulfide ions may be a source of contamination of LEDs. The migrating sulfide ions may react with some of the layers of the LEDs, such as reflective metallic layers. For example, silver may be used to create a reflective mirror within gallium nitride (GaN) epitaxial layers to enhance light extraction within LEDs. Silver may react with the sulfide ions to create brown silver sulfide. The silver sulfide is dark and non-reflective, reducing the effective light output of the LEDs.

Other sources of contamination in packaged LEDs include moisture and an encapsulation layer. The encapsulation layer may contain contaminants, such as halogens. Halogens, such as chloride or bromide, may react with aluminum metallization on the LED and corrode the LED. Encapsulation layers are typically present in LEDs packaged in flip chip geometry but are not typically present in LEDs having a conventional geometry.

Figure 1:
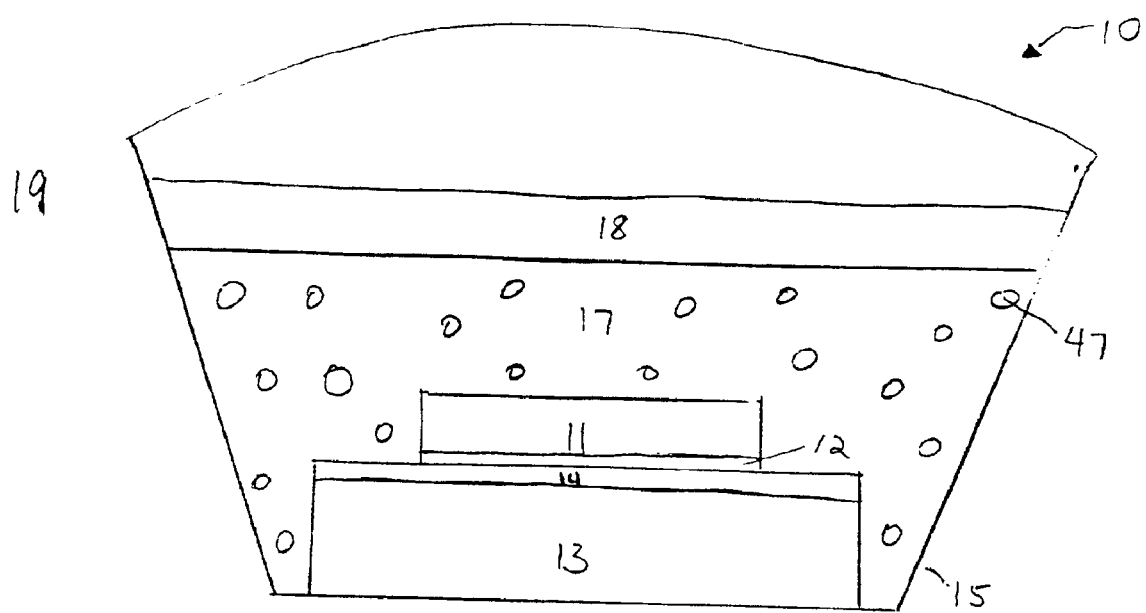
FIG. 1 is a schematic diagram of a packaged flip chip light emitting diode.

FIG. 1 illustrates a LED 10 having a flip chip geometry. The packaged flip chip LED 10 includes a LED 11 and a submount 13 disposed in a reflector cup 15, which is surrounded by a lens 19. The LED 11 is inverted so that a first surface 12 (i.e., anode and cathode electrodes) is facing the first surface 14 of the submount 13 and bonded to electrical leads on the submount 13. The submount 13 may be a silicon substrate or any other suitable submount.

Phosphor material 17 is disposed on at least a portion of the LED 11. The phosphor material may include a sulfur compound, such as strontium thiogallate, calcium thiogallate, strontium sulfide, and any combination thereof. In one embodiment, the phosphor material 17 may be dispersed as phosphor particles 47 in another material, such as conventional silicone polymer composition.

Encapsulation material 18 may be disposed over the phosphor material 17. The encapsulation material 18 may be conventional silicone polymer composition. The encapsulation material may contain contaminants, such as halogens, for example, chloride or bromide.

Flip chip LEDs are further described in U.S. application Ser. No. 09/469,657, filed Dec. 22, 1999, entitled "III-Nitride Light-Emitting Device With Increased Light Generating Capability," by Michael Krames, Daniel A. Steigerwald, Fred A Kish Jr., Pradeep Rajkomar, Jonathan J. Wierer Jr., and Tun S. Tan, incorporated herein by reference. Phosphors are further described in U.S. application Ser. No. 09/827,382, filed Apr. 4, 2001, entitled "Phosphor Converted Light Emitting Diode," by Gerd O. Mueller and Regina B. Mueller-Mach, incorporated herein by reference, and in U.S. application Ser. No. 09/688,053, filed Oct. 13, 2000, entitled "Stenciling Phosphor Layers on Light Emitting Diodes," by Christopher Haydn Lowery, incorporated herein by reference.

In contrast to flip chip geometry LEDs, conventional geometry LEDs typically have one or more wirebonds electrically coupling electrodes on the surface of the LED facing away from the substrate to contacts on the substrate. Phosphor material may be disposed over at least a portion of the LED. The present invention is applicable to all types of LEDs.

Figure 2:
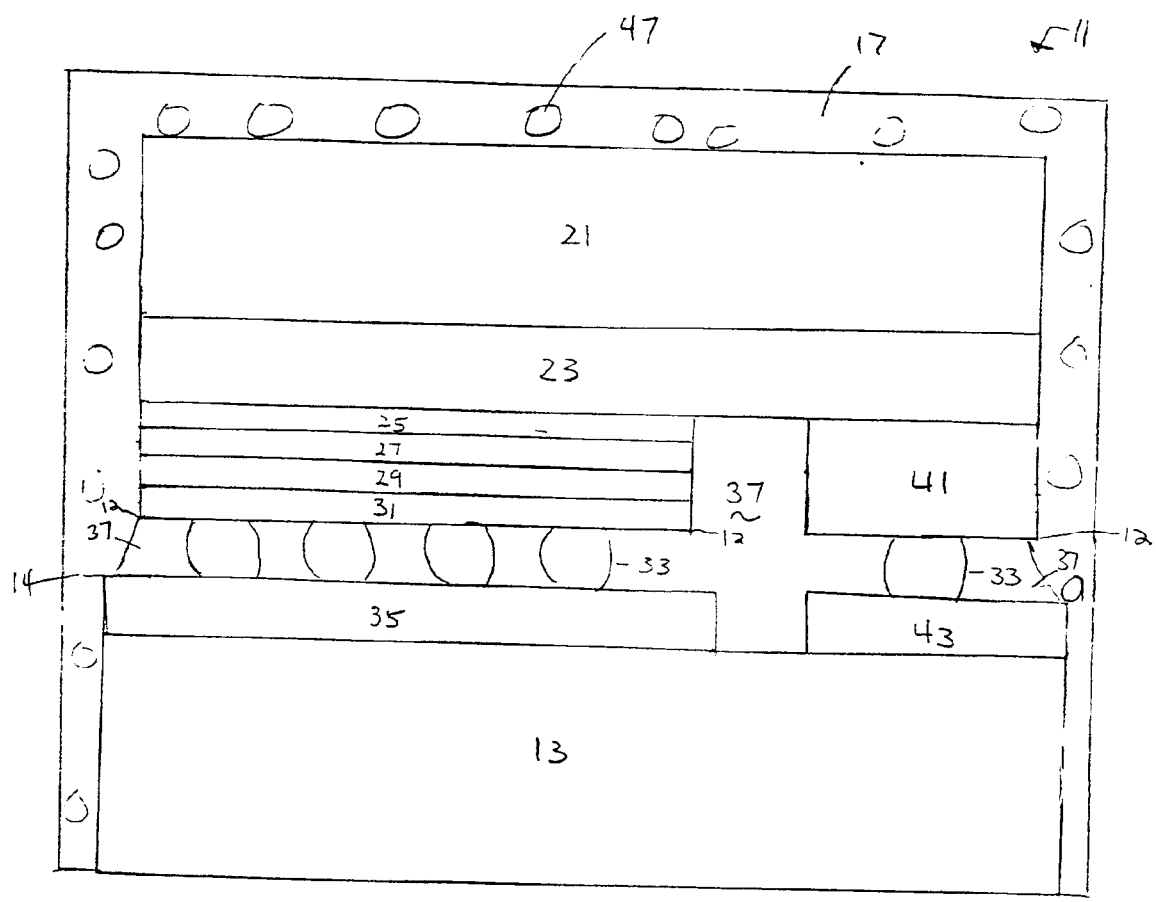
FIG. 2 is a schematic diagram of a flip chip light emitting diode, according to an embodiment of this present invention.
Figure 1:
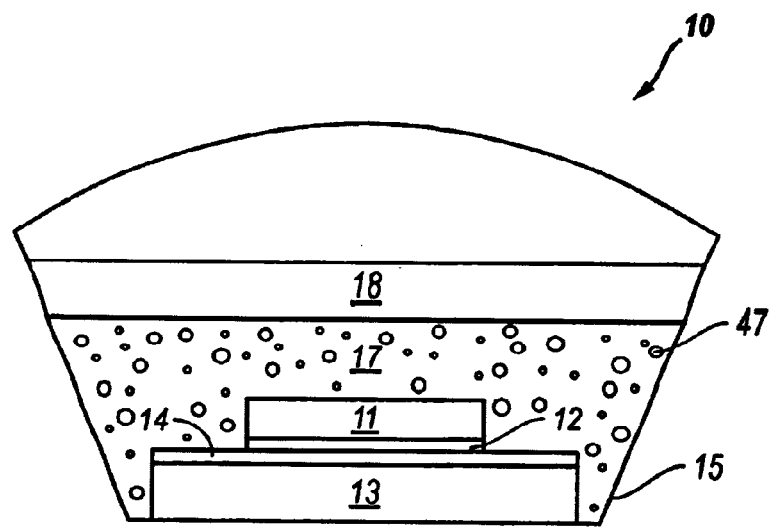
Figure 2:
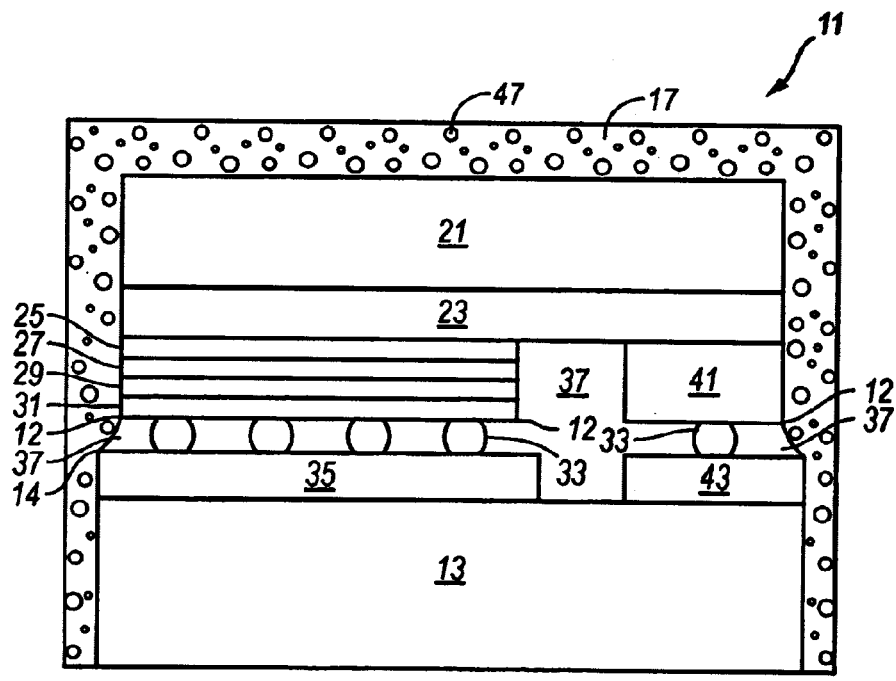

FIG. 2 illustrates in more detail a typical LED 11 and a submount 13. The LED 11 includes a transparent superstrate 21, a semiconductor layer 23 of a first conductivity type, an active region 25, and a semiconductor layer 27 of a second conductivity type. The transparent superstrate 21 may be formed, for example, from sapphire ($Al_2O_3$) or silicon carbide. The semiconductor layer 23 of a first conductivity type and the semiconductor layer 27 of a second conductivity type are electrically coupled to the active region 25. Active region 25 is, for example, a p-n junction associated with the interface of layers 23 and 27 or multiple semiconductor layers forming quantum wells. The semiconductor layers may be doped or undoped.

Contacts 31 and 41 are electrically coupled to semiconductor layers 27 and 23, respectively. Interconnects 33 electrically couple contacts 31 and 41 to the submount contacts 35 and 43, respectively. Active region 25 emits light upon application of a suitable voltage across contacts 31 and 41. Some of the light travels through layer 27 and is reflected upward by the reflective layer 29 through the transparent superstrate 21 as well as the sidewalls. The reflective layer 29 may be made of silver or any other suitable reflective metal.

Phosphor material 17 is disposed on at least a portion of the LED 11. The phosphor material may include a sulfur compound, such as strontium thiogallate, calcium thiogallate, strontium sulfide, and any combination thereof. In one embodiment, the phosphor material 17 may be dispersed as phosphor particles 47 in another material, such as conventional silicone polymer composition.

Although FIG. 2 illustrates a particular LED structure, the present invention is independent of the number of semiconductor layers in LED 11 and independent of the detailed structure of active region 25.

The contamination of an LED 11 by sulfide ions, halogens, water, or other contaminants is reduced by the use of a physical barrier or a gettering compound. The physical barrier may be an underfill 37, as shown in FIG. 2, or a coating. In an LED having flip chip geometry, the underfill 37 is disposed between a first, active surface 12 of the LED 11 and the first surface 14 of the submount 13.

In an LED having conventional geometry, the physical barrier may be a die coating. The phosphor material 17 may be disposed over a first surface 12 of the LED 11, and coating may be disposed over the phosphor material 17. The coating may be transparent to the wavelength emitted by the LED 11.

The underfill 37 may have a low viscosity for easier dispensing. The underfill 37 may comprise cyanate ester resin, epoxy resin, epoxy, urethane, acrylate, other organic materials, or any combination thereof. In one embodiment, the underfill 37 may be Product Number UF8800, available from Honeywell Electronic Materials, Carlsbad, Calif. The density of the underfill material may create a physical barrier to contaminants, slowing the diffusion of the contaminants through the underfill.

In one embodiment, the underfill 37 includes a filler, which may reduce the coefficient of thermal expansion. During curing and thermal processing, the underfill typically expands, which exerts stress on the LED. The filler may reduce the thermal expansion of the underfill. The filler may comprise silicon dioxide, fumed silica, titanium dioxide, inorganic silicates, inorganic clays, inert metals, metal oxides, or any combination thereof. The particle size of the filler may be less than about ten microns in diameter.

In one embodiment, the filler is reflective. The filler reflects some of the light radiating downward from the LED active region 25. Reflective fillers include titanium dioxide and calcium carbonate. Titanium dioxide particles, which are approximately the same size as the phosphor particles 47, increase the scattering of light emitted by active region 25 and thus increase the absorption of that light by the phosphor particles 47. In another embodiment, the filler is able to withstand the die junction temperature, which is about 100° C.

A gettering compound can be disposed over a LED or as part of the underfill 37. The gettering compound may be disposed in the path of the migrating contaminants so that the contaminant reaches the gettering compound before it reaches the LED. For example, the gettering compound may be part of the underfill in a LED having flip chip geometry, a die coating on a LED having conventional geometry, or a component of the phosphor formulation. As a die coating on a LED having conventional geometry, the gettering compound may be mixed with a suitable carrier and disposed over the top or bottom surface of the LED die. A suitable carrier includes but is not limited to a two part curable silicone, epoxy, or acrylic. As a component of the phosphor formulation, the gettering compound may be about one percent to about ten percent by weight of the phosphor formulation.

A gettering compound comprises a gettering ion and a counter-ion. The gettering ion reacts with a contaminant to form an insoluble reaction product. For example, where the contaminant is a sulfide ion, and the gettering ion is a metal ion, M⁺, the reaction would be

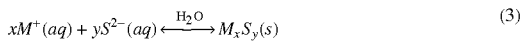

The insoluble reaction product, $M_xS_y$, is inert in the LED environment and prevents the release of the captured sulfide ion. In other words, the solubility product, $K_{sp}$, of the reaction product in the LED environment must be exceedingly small so that the sulfide ion remains bonded to the gettering ion. The solubility product is equal to $$K_{sp}=[M^+]^x [S^{2-}]_y \qquad (4)$$

where the [ ] notation refers to the ionic concentration of each ion in moles/liter, and the superscripts x and y refer to the number of each ion created in the dissociation reaction of equation (3). A high solubility product represents a soluble material, while a low solubility product represents an insoluble material. A soluble material is more likely to release the captured sulfide ion than an insoluble material is. Thus, an ion that forms a low solubility product with the sulfide ion is desirable for the gettering ion. A low solubility product may be less than about $10^{-30}$.

The gettering ion includes but is not limited to a Group VA element, a Group VB element, a Group VIB element, a Group IVA element, an organic ligand, and any combination thereof. As used herein, "VA," "VB," "VIB," and "IVA" designate columns in the periodic table of the elements in accordance with the Chemical Abstracts Service numbering system. The gettering ion may be chromium, molybdenum, tungsten, vanadium, niobium, tantalum, bismuth, hafnium, lead, and any combination thereof.

The counter ion may be any suitable negative ion to the positive charge of the gettering ion, such as sulfate or citrate. Certain counter ions are unsuitable. For example, halogens may corrode a LED by reacting with an aluminum metallization layer on a LED and thus are generally unsuitable counter ions.

An example of a gettering compound is chromium (III) sulfate in the trivalent state. The sulfur present in the sulfate is fully oxidized and non-reactive. The solubility product of chromium (III) sulfate is approximately $6 \times 10^{-31}$. Another example of a gettering compound is bismuth citrate, which has a solubility product of about $1.82 \times 10^{-99}$.

In one embodiment, the gettering compound may be mixed with fumed silica. The fumed silica disperses particles and prevents the gettering compound from "caking" or clumping together. The gettering compound may be mixed with 0.1% by weight of fumed silica. The fumed silica may be ten micrometers or less.

The invention is described in more detail by the way of the following example. The following example is presented solely for the purpose of further illustrating and disclosing one embodiment of the present invention, and is not to be construed as limiting the invention.

EXAMPLE 1

Four sets of flip chip LEDs with a silver reflective layer and phosphors were built. The phosphor material was strontium thiogallate doped with cerium. The first set was not coated or underfilled. The second, third, and fourth sets included underfill, specifically Product Number UF8800, available from Honeywell Electronic Materials, Carlsbad, Calif. The third set included chromium (III) sulfate in the underfill, and the fourth set included bismuth citrate in the underfill. All the sets were subjected to operation at a maximum-rated current of 350 milliamps in a 85° C. environment at 85% humidity.

At 1000 hours of operation, the light output of the first set without underfill degraded about 65%. The light output of the second set with underfill degraded by about 45%. The light output of the third set with underfill and chromium (III) sulfate degraded by about 55%. The light output of the fourth set with underfill and bismuth citrate degraded by about 35%.

The LEDs with an underfill degraded less than the LED without an underfill. In addition, the light degradation of the LED with underfill and the LED with underfill and bismuth citrate met the reliability standard for commercial LEDs of less than about 50% degradation. Thus, the LED with underfill and the LED with underfill and bismuth citrate would be suitable for commercial use.

While particular embodiments of the present invention have been shown and described, it will be obvious to those skilled in the art that changes and modifications may be made without departing from this invention in its broader aspects.

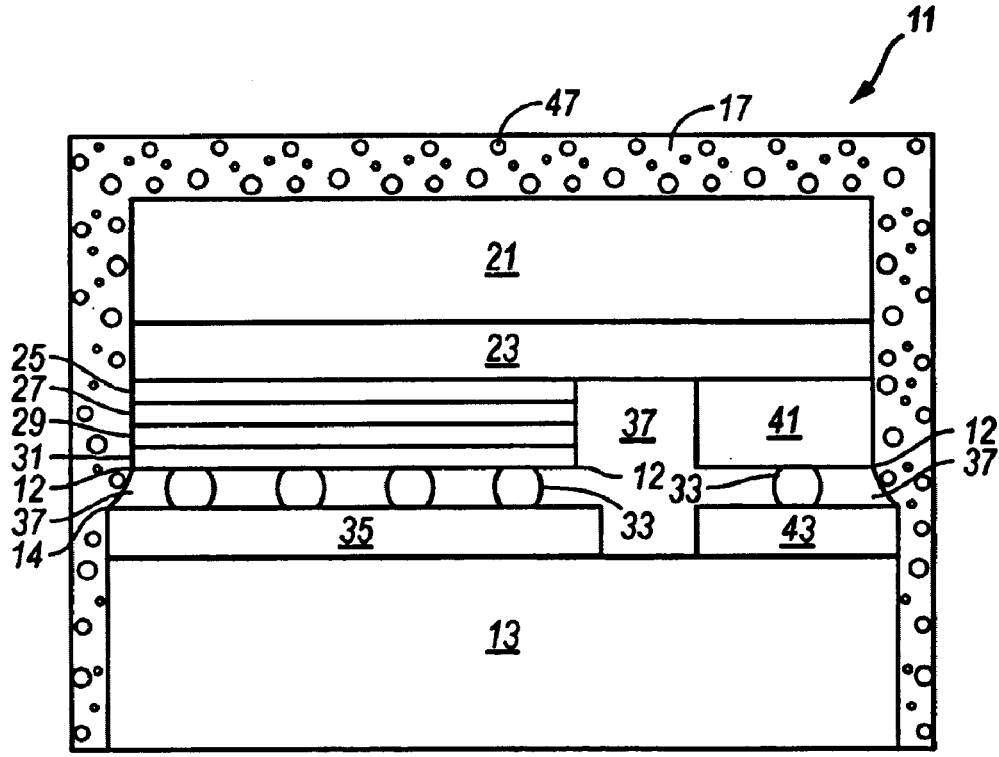

What is claimed is:

1. A light emitting device comprising:
   a light emitting diode;
   a submount;
   a phosphor material disposed around at least a portion of said light emitting diode; and
   an underfill between a first surface of the light emitting diode and a first surface of the submount, wherein the underfill has characteristics to reduce contamination of the light emitting diode by the phosphor material, and wherein the underfill comprises a material selected from a group consisting of cyanate ester resin, epoxy resin, epoxy, urethane, acrylate, and any combination thereof.

2. The light emitting device of claim 1, wherein the light emitting diode has a reflective layer.

3. The light emitting device of claim 2, wherein the reflective layer comprises silver.

4. The light emitting device of claim 1, wherein the submount comprises a silicon substrate.

5. The light emitting device of claim 1, wherein the phosphor material comprises a material selected from a group consisting of strontium thiogallate, calcium thiogallate, strontium sulfide, and any combination thereof.

6. The light emitting device of claim 1, wherein the phosphor material comprises a sulfur compound.

7. The light emitting device of claim 1, wherein the phosphor material is included in a phosphor formulation, the phosphor formulation further comprising a gettering compound, the gettering compound comprising a gettering ion and a counter-ion, said gettering ion comprising a material selected from a group consisting of Group VA elements, Group VB elements, Group VIB elements, Group IVA elements, organic ligands, and any combination thereof.

8. The light emitting device of claim 7, wherein the gettering compound comprises about one to about ten weight percent of the phosphor formulation.

9. The light emitting device of claim 1, wherein the underfill comprises a filler.

10. The light emitting device of claim 9, wherein the filler comprises a material selected from a group consisting of silicon dioxide, fumed silica, titanium dioxide, inorganic silicates, inorganic clays, inert metals, metal oxides, and any combination thereof.

11. The light emitting device of claim 9, wherein the filler is reflective.

12. The light emitting device of claim 1, wherein the underfill comprises a gettering compound, the gettering compound comprising a gettering ion and a counter-ion, said gettering ion comprising a material selected from a group consisting of Group VA elements, Group VB elements, Group VIB elements, Group WA elements, organic ligands, and any combination thereof.

13. The light emitting device of claim 12, wherein the underfill further comprises fumed silica.

14. The light emitting device of claim 12, wherein the gettering ion comprises a material selected from a group consisting of chromium, molybdenum, tungsten, vanadium, niobium, tantalum, bismuth, hathium, lead, and any combination thereof.

15. The light emitting device of claim 12, wherein the gettering ion and a sulfide ion form a compound with a solubility product less than about $10^{-30}$.

16. The light emitting device of claim 12, wherein the counter-ion is one of sulfate and citrate.

17. The light emitting device of claim 1, wherein the light emitting diode is mounted on the submount.

18. The light emitting device of claim 1, further comprising a coating comprising a gettering compound, the gettering compound comprising a gettering ion and a counter-ion, the coating being disposed between the light emitting diode and the phosphor material.

19. The light emitting device of claim 18, wherein the coating comprises a carrier selected from the group of two part curable silicon, epoxy, and acrylic.

20. A structure comprising:
a semiconductor light emitting device;
a submount;
a material containing a phosphor disposed around at least a portion of semiconductor light emitting device; and
an underfill disposed in at least a portion of a space between the semiconductor light emitting diode and the submount such that the underfill completely fills the space between the semiconductor light emitting device and the submount and forms a physical barrier that prevents the phosphor-containing material from occupying the space.

21. The structure of claim 20, wherein the underfill comprises a material selected from a group consisting of cyanate ester resin, epoxy resin, epoxy, urethane, acrylate, and any combination thereof.

22. The structure of claim 20, wherein the underfill comprises a filler.

23. The structure of claim 22, wherein the filler comprises a material selected from a group consisting of silicon dioxide, fumed silica, titanium dioxide, inorganic silicates, inorganic clays, inert metals, metal oxides, and any combination thereof.

24. The structure of claim 22, wherein the filler is reflective.

25. The structure of claim 20, wherein the underfill comprises a gettering compound, the gettering compound comprising a gettering ion and a counter-ion.

26. A structure comprising:
a semiconductor light emitting device;
a material containing a phosphor disposed around at least a portion of semiconductor light emitting device; and
a gettering compound comprising a gettering ion and a counter-ion, the gettering compound positioned to prevent the phosphor-containing material from contaminating the semiconductor light emitting device.

27. The structure of claim 26 wherein the gettering compound is included in a coating disposed between the phosphor-containing material and the semiconductor light emitting device.

28. The structure of claim 26 wherein the gettering compound is included in the material.

29. The structure of claim 26 wherein the semiconductor light emitting device is mounted on a submount, and the gettering compound is included in an underfill disposed between the semiconductor light emitting device and the submount.

30. The structure of claim 26 wherein the gettering ion comprises a material selected from a group consisting of Group VA elements, Group VB elements, Group VIB elements, Group IVA elements, organic ligands, and any combination thereof.

31. The structure of claim 26, wherein the counter-ion is one of sulfate and citrate.

32. The structure of claim 26, wherein the semiconductor light emitting device includes a contact comprising silver.

33. The structure of claim 26, wherein the phosphor comprises a material selected from a group consisting of strontium thiogallate, calcium thiogallate, strontium sulfide, and any combination thereof.

34. The structure of claim 26, wherein the phosphor comprises a sulfur compound.

35. The structure of claim 26, wherein the gettering ion comprises a material selected from a group consisting of chromium, molybdenum, tungsten, vanadium, niobium, tantalum, bismuth, hathium, lead, and any combination thereof.

36. The structure of claim 26, wherein the phosphor comprises a sulfide ion, and wherein the gettering ion and the sulfide ion form a compound with a solubility product less than about $10^{-30}$.

* * * * *

UNITED STATES PATENT AND TRADEMARK OFFICE
CERTIFICATE OF CORRECTION

PATENT NO. : 6,878,973 B2
DATED : April 12, 2005
INVENTOR(S) : Christopher Haydn Lowery and Troy Trottier It is certified that error appears in the above-identified patent and that said Letters Patent is hereby corrected as shown below:

Delete Title page illustrating figure, and substitute therefor new Title page illustrating figure; (attached).

Delete drawing sheets 1-2, and substitute therefor drawing sheet 1, with the attached sheet.

Signed and Sealed this

Eleventh Day of October, 2005

JON W. DUDAS
*Director of the United States Patent and Trademark Office*

(12) United States Patent
Lowery et al.

(10) Patent No.: US 6,878,973 B2
(45) Date of Patent: Apr. 12, 2005

(54) REDUCTION OF CONTAMINATION OF LIGHT EMITTING DEVICES

(75) Inventors: Christopher Haydn Lowery, Fremont, CA (US); Troy Trottier, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 134 days.

(21) Appl. No.: 09/938,407

(22) Filed: Aug. 23, 2001

(65) Prior Publication Data

US 2003/0071568 A1 Apr. 17, 2003

(51) Int. Cl.$^7$ .......................... H01L 33/00; H01L 23/29
(52) U.S. Cl. ..................... 257/100; 257/98; 257/99; 257/789; 257/795
(58) Field of Search .................. 257/98–100, 729, 257/753, 788, 789, 791, 795; 438/26, 28, 29, 34–35

(56) References Cited

U.S. PATENT DOCUMENTS

| | | | | |
|---|---|---|---|---|
| 5,561,329 A | * | 10/1996 | Mine et al. | 257/788 |
| 6,132,569 A | * | 10/2000 | Shiozaki | 204/192.27 |
| 6,455,878 B1 | * | 9/2002 | Bhat et al. | 257/99 |
| 2002/0187571 A1 | * | 12/2002 | Collins, III et al. | 438/29 |

FOREIGN PATENT DOCUMENTS

EP      0 926 744 A2      6/1999

* cited by examiner

*Primary Examiner*—Donghee Kang
(74) *Attorney, Agent, or Firm*—Patent Law Group LLP

(57) ABSTRACT

A light emitting device and a method of making the same are provided. The light emitting device includes a light emitting diode and a submount. A phosphor material is disposed around at least a portion of the light emitting diode. An underfill is disposed between a first surface of the light emitting diode and a first surface of the submount. The underfill reduces contamination of the light emitting diode by the phosphor material.

36 Claims, 2 Drawing Sheets